US012757427B2

(12) United States Patent
Iucolano et al.

(10) Patent No.: US 12,757,427 B2
(45) Date of Patent: Oct. 6, 2026

(54) ENHANCEMENT-MODE HEMT AND MANUFACTURING PROCESS OF THE SAME

(71) Applicant: STMICROELECTRONICS S.r.l., Agrate Brianza (IT)

(72) Inventors: Ferdinando Iucolano, Gravina di Catania (IT); Filippo Giannazzo, Catania (IT); Giuseppe Greco, Misterbianco (IT); Fabrizio Roccaforte, Mascalucia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 686 days.

(21) Appl. No.: 18/158,986

(22) Filed: Jan. 24, 2023

(65) Prior Publication Data

US 2023/0246100 A1 Aug. 3, 2023

(30) Foreign Application Priority Data

Jan. 31, 2022 (IT) ........................ 102022000001550

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 64/01* (2025.01);
(Continued)

(58) Field of Classification Search
CPC .... H10D 30/475; H10D 30/015; H10D 64/01; H10D 64/258; H10D 64/411;
(Continued)

(56) References Cited

U.S. PATENT DOCUMENTS 9,419,121 B1 8/2016 Teo et al.
2010/0025730 A1 * 2/2010 Heikman ........... H10D 30/4755 257/E21.403
(Continued)

FOREIGN PATENT DOCUMENTS

CN 108258035 A * 9/2020 ........... H10D 30/015
CN 108258035 B 9/2020
(Continued)

OTHER PUBLICATIONS

Jadwiszczak et al., "Plasma Treatment of Ultrathin Layered Semiconductors for Electronic Device Applications", ACS Applied Electronic Materials, pp. A-Y (Year: 2021).*
(Continued)

*Primary Examiner* — William B Partridge
*Assistant Examiner* — Erik A. Anderson
(74) *Attorney, Agent, or Firm* — Seed Intellectual Property Law Group LLP

(57) ABSTRACT

An enhancement mode high electron-mobility transistor (HEMT) device includes a semiconductor body having a top surface and including a heterostructure configured to generate a two-dimensional electron gas, 2DEG. The HEMT device includes a gate structure which extends on the top surface of the semiconductor body, is biasable to electrically control the 2DEG and includes a functional layer and a gate contact in direct physical and electrical contact with each other. The gate contact is of conductive material and the functional layer is of two-dimensional semiconductor material and includes a first doped portion with P-type electrical conductivity, which extends on the top surface of the semiconductor body and is interposed between the semiconductor body and the gate contact along a first axis.

18 Claims, 9 Drawing Sheets

(51) Int. Cl.

| | |
|---|---|
| ***H10D 64/01*** | (2025.01) |
| ***H10D 64/23*** | (2025.01) |
| ***H10D 64/27*** | (2025.01) |
| ***H10P 14/20*** | (2026.01) |
| ***H10P 14/24*** | (2026.01) |
| ***H10P 14/40*** | (2026.01) |
| ***H10P 50/00*** | (2026.01) |
| ***H10P 50/24*** | (2026.01) |
| ***H10P 76/20*** | (2026.01) |

(52) U.S. Cl.

CPC ......... *H10D 64/258* (2025.01); *H10D 64/411* (2025.01); *H10P 14/24* (2026.01); *H10P 14/3434* (2026.01); *H10P 14/40* (2026.01); *H10P 14/412* (2026.01); *H10P 50/242* (2026.01); *H10P 50/692* (2026.01); *H10P 50/695* (2026.01); *H10P 76/202* (2026.01)

(58) Field of Classification Search

CPC .. H10D 62/82; H10D 62/8503; H10D 62/343; H10D 62/149; H01L 21/02565; H01L 21/0262; H01L 21/0272; H01L 21/28506; H01L 21/3065; H01L 21/3081; H01L 21/3086; H01L 21/32051; H10P 14/24; H10P 14/3434; H10P 14/40; H10P 14/412; H10P 50/242; H10P 50/692; H10P 50/695; H10P 76/202

See application file for complete search history.

(56) References Cited

U.S. PATENT DOCUMENTS

| | | | | |
|---|---|---|---|---|
| 2013/0083567 | A1* | 4/2013 | Imada | H10D 64/251 257/192 |
| 2013/0240901 | A1* | 9/2013 | Kohda | H10D 30/015 257/76 |
| 2014/0361341 | A1* | 12/2014 | Sriram | H10D 30/4755 257/194 |
| 2015/0311084 | A1* | 10/2015 | Moore | H01L 21/28581 438/572 |
| 2020/0043717 | A1* | 2/2020 | Ueno | G03F 7/2004 |
| 2021/0313262 | A1* | 10/2021 | Fu | H10D 84/85 |
| 2022/0238721 | A1* | 7/2022 | Nguyen | H10D 30/47 |
| 2023/0011913 | A1* | 1/2023 | Henriksen | H10D 30/475 |

FOREIGN PATENT DOCUMENTS

| | | | |
|---|---|---|---|
| EP | 3840055 | A1 | 6/2021 |
| WO | 2018006779 | A1 | 1/2018 |

OTHER PUBLICATIONS

Chromik et al., "Influence of GaN/AlGaN/GaN (0001) and Si (100) substrates on structural properties of extremely thin $MoS_2$ films grown by pulsed laser deposition," *Applied Surface Science* 395:232-236, 2017.

Ghasemi et al., "Controlled Plasma Thinning of Bulk $MoS_2$ Flakes for Photodetector Fabrication," *ACS Omega* 4:19693-19704, 2019.

Giannazzo et al., "Ambipolar $MoS_2$ Transistors by Nanoscale Tailoring of Schottky Barrier Using Oxygen Plasma Functionalization," *ACS Appl. Mater. Interfaces* 9:23164-23174, 2017.

Giannazzo et al., "Integration of 2D Materials with Nitrides for Novel Electronic and Optoelectronic Applications," *Nitride Semiconductor Technology: Power Electronics and Optoelectronic Devices*, Wiley-VCH Verlag GmbH & Co. KGaA, 2020, pp. 397-438.

Hao et al., "Normally-off p-GaN/AlGaN/GaN high electron mobility transistors using hydrogen plasma treatment," *Applied Physics Letters* 109:152106, 2016.

Jadwiszczak et al., "Plasma Treatment of Ultrathin Layered Semiconductors for Electronic Device Applications," ACS Appl. Electron. Mater, 2021, 3, 4, 1505-1529.

Li et al., "P-type Doping in Large-Area Monolayer $MoS_2$ by Chemical Vapor Deposition," *ACS Appl. Mater. Interfaces* 12:6276-6282, 2020.

Lin, "Market and Technology Trends in WBG Materials for Power Electronics Applications," CS Mantech Conference, May 18-21, 2015, Scottsdale, Arizona, USA, pp. 33-36.

Qian et al., "2D materials as semiconducting gate for field-effect transistors with inherent over-voltage protection and boosted ON-current," *2D Materials and Applications* 3:24, 2019.

Roccaforte et al., "Physics and technology of gallium nitride materials for power electronics," *Rivista Del Nuovo Cimento* 41(12):625-681, 2018.

Ruzmetov et al., "Vertical 2D/3D Semiconductor Heterostructures Based on Epitaxial Molybdenum Disulfide and Gallium Nitride," *ACS Nano* 10:3580-3588, 2016.

Suh et al., "Doping against the Native Propensity of $MoS_2$: Degenerate Hole Doping by Cation Substitution," *Nano Letters*, 2014. (7 pages).

Yuliang et al., "AlGaN/GaN high electron mobility transistors with selective area grown p-GaN gates," *Journal of Semiconductors* 37(11):114002-1-114002-5, Nov. 2016.

* cited by examiner

ENHANCEMENT-MODE HEMT AND MANUFACTURING PROCESS OF THE SAME

BACKGROUND

Technical Field

The present disclosure relates to an improved enhancement-mode HEMT and to a manufacturing process of the same. In particular, it relates to an enhancement-mode HEMT including a gate structure which extends on a semiconductor body and has a gate contact and a functional layer of two-dimensional semiconductor (e.g., transition-metal dicalcogenide), interposed between the semiconductor body and the gate contact.

Description of the Related Art

As known, a HEMT device includes a heterostructure having an interface between two different semiconductor materials such as for example aluminum gallium nitride (AlGaN) and gallium nitride (GaN). The HEMT device based on the AlGaN/GaN heterostructure has a two-dimensional electron gas (2DEG) at this interface.

The 2DEG layer represents a high charge density electron cloud and wherein the charges have high mobility. These properties make the HEMT device attractive for radio frequency (RF) and power electronics applications. In particular, HEMTs have high breakdown fields (equal to about 2 MV/cm-4 MV/cm) and high density of charge carriers and 2DEG mobility (e.g., respectively greater than about $10^{13}$ $cm^{-2}$ and about 1000 $cm^2V^{-1}$ $s^{-1}$-2000 $cm^2V^{-1}$ $s^{-1}$).

Generally known GaN/AlGaN HEMTs are in depletion-mode, i.e., normally on. However, in different applications, GaN/AlGaN HEMTs in enhancement-mode, i.e., normally off, are utilized to improve the reliability of the respective electronic circuits and to reduce the design complexity and power consumption thereof.

Different solutions are currently known for providing enhancement-mode HEMTs. Some enhancement-mode HEMTs of a known type are shown in FIGS. 1A-1D (illustrated with reference to a triaxial Cartesian system defined by an X axis, a Y axis and a Z axis, orthogonal to each other).

In particular, FIG. 1A shows a HEMT 1 of a known type including, superimposed on each other along the Z axis, a substrate 3 of semiconductor material (e.g., silicon or silicon carbide), a first structural layer 5 of GaN and a second structural layer 7 of AlGaN having a bottom surface 7*a* facing the first structural layer 5 and a top surface 7*b* opposite to the bottom surface 7*a* with respect to the Z axis. The HEMT 1 also includes a source contact 8 and a drain contact 9, of metal material, physically decoupled from each other and extending on the top surface 7*b* of the second structural layer 7. Moreover, the HEMT 1 includes a trench gate contact 10 extending into the second structural layer 7, recessed to form a trench. In particular, the trench gate contact 10 extends partly inside the trench in the second structural layer 7 and partly outside it. The presence of the trench gate contact 10 reduces, at the trench gate contact 10 (in detail, below the latter), the thickness of the second structural layer 7, measured along the Z axis, and therefore, due to the resulting modification of the band diagram of the HEMT 1, it prevents the formation of the 2DEG (here indicated with the reference 11) below the trench gate contact 10, in the absence of gate voltage $V_G$ applied.

FIG. 1B shows a HEMT 1 of a known type and with a structure similar to that of FIG. 1A. However, here the gate contact 10 is not trenched and extends above the top surface 7*b* of the second structural layer 7. Moreover, below the gate contact 10, there extends a 2DEG interruption region 13 of the second structural layer 7 (for example extending from the top surface 7*b* towards the bottom surface 7*a*, without reaching the latter), wherein negatively charged species (such as fluorine ions, $F^-$) have been incorporated. These negative charges in the 2DEG interruption region 13 modify the band diagram of the HEMT 1 and prevent the formation of the 2DEG 11 below the trench gate contact 10 in the absence of the gate voltage $V_G$ applied.

FIG. 1C shows a HEMT 1 of a known type and with a structure similar to that of FIG. 1A. However, here the gate contact 10 is not a trench contact and extends above the top surface 7*b* of the second structural layer 7, without being in direct physical contact therewith. Moreover, a functional layer 15 of GaN with a P-type electrical conductivity extends between the gate contact 10 and the second structural layer 7. The functional layer 15 is doped with doping species such as magnesium and has a thickness, measured along the Z axis, equal to about 50 nm and in any case designed in such a way that it modifies the band diagram of the HEMT 1 to prevent the formation of the 2DEG 11 below the trench gate contact 10 in the absence of the gate voltage $V_G$ applied (further details in this regard may be found in the paper "Physics and technology of gallium nitride materials for power electronics," F. Roccaforte, P. Fiorenza, R. Lo Nigro, F. Giannazzo, G. Greco, La Rivista del Nuovo Cimento).

FIG. 1D shows a HEMT 1 (in detail, a MISHEMT) of a known type and with a structure similar to that of FIG. 1A. However here the trench gate contact 10 extending into the second structural layer 7 is surrounded by a dielectric region 17 which is physically interposed between the second structural layer 7 and the trench gate contact 10 and which further extends on the top surface 7*b* of the second structural layer 7, between the source contact 8 and the drain contact 9. In FIG. 1D the trench extends along the Z axis throughout the entire second structural layer 7 and, partly, also into the first structural layer 5. The trench gate contact 10 and the dielectric region 17 allow the interruption of the 2DEG 11 at the latter and in the absence of the gate voltage $V_G$ applied.

However, the known solutions have different problems such as manufacturing difficulties and low reliability of the HEMT.

For example, with regard to the HEMT 1 of FIG. 1C, reaching hole concentrations of in the functional layer 15 sufficiently high to prevent the formation of the 2DEG 11 may be difficult, due to the high ionization energy of the magnesium acceptors. Moreover, the functional layer 15 is normally defined, from a p-GaN layer uniformly deposited on the top surface 7*b*, by plasma etching; however this plasma etching is difficult to be precisely controlled and may damage the regions of the top surface 7*b* that remain exposed, introducing defects in the crystal lattice of the second structural layer 7. Alternative manufacturing processes that do not utilize plasma etching include for example a selective growth of the functional layer 15 (however it is complicated to use processes such as metal-organic chemical vapor deposition (MOCVD) on wide wafer areas in a controlled manner; further details regarding this process may be found in the paper H. Yuliang, et al., "AlGaN/GaN high electron mobility transistors with selective area grown p-GaN gates," Journal of Semiconductors, 37.114002 (2016)) or a hydrogen plasma deactivation of the functional layer 15 outside the region for becoming the gate region (however a reactivation of the functional layer 15 may occur if thermal processes are performed on the HEMT after having performed the hydrogen plasma treatment; further details regarding this process may be found in the paper R. Hao, et al., "Normally-off p-GaN/AlGaN/GaN high electron mobility transistors using hydrogen plasma treatment," Appl. Phys. Lett., 109.152106 (2016)).

Consequently, none of the currently known solutions provide a reliable enhancement-mode HEMT with optimal electrical performances.

BRIEF SUMMARY

One embodiment of the present disclosure provides an enhancement-mode HEMT and a manufacturing process of the same, which overcome the drawbacks of the prior art.

In one embodiment, an enhancement mode high-electron-mobility transistor (HEMT) device includes a semiconductor body having a top surface and including a heterostructure configured to generate a two-dimensional electron gas (2DEG). The HEMT device includes a gate structure on the top surface of the semiconductor body. The gate structure includes a functional layer and a gate contact in direct physical and electrical contact with the functional layer. The gate structure is biasable to electrically control the 2DEG. The gate contact is of conductive material and the functional layer is of two-dimensional semiconductor material and includes a first doped portion with P-type electrical conductivity on the top surface of the semiconductor body and is interposed between the semiconductor body and the gate contact along a first axis.

BRIEF DESCRIPTION OF THE SEVERAL VIEWS OF THE DRAWINGS

For a better understanding of the present disclosure, a preferred embodiment is now described, purely by way of non-limiting example, with reference to the attached drawings, wherein.

DETAILED DESCRIPTION

In particular, the figures are shown with reference to a triaxial Cartesian system defined by an X axis, a Y axis and a Z axis, orthogonal to each other.

In the following description, elements common to the different embodiments have been indicated with the same reference numbers.

Figure 1A:
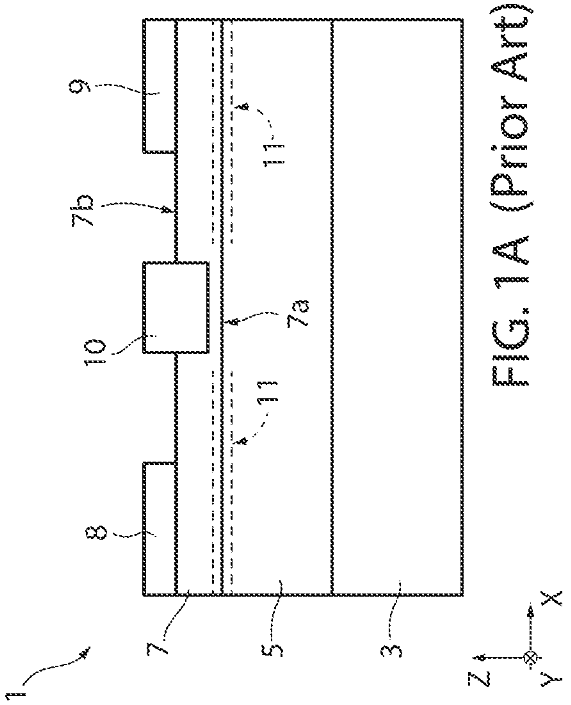
FIG. 1A (Prior Art)
FIGS. 1A-1D show lateral cross-section views of respective HEMTs of known type.
Figure 1B:
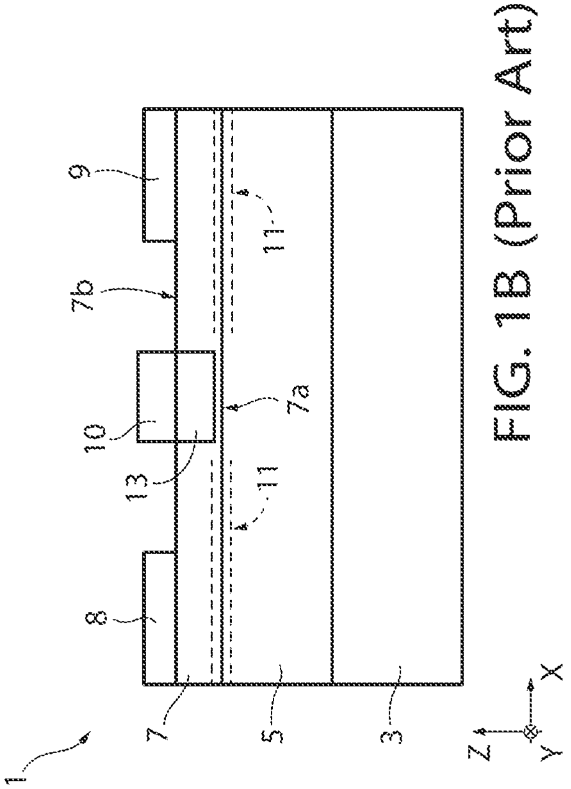
FIG. 1B (Prior Art)
Figure 1C:
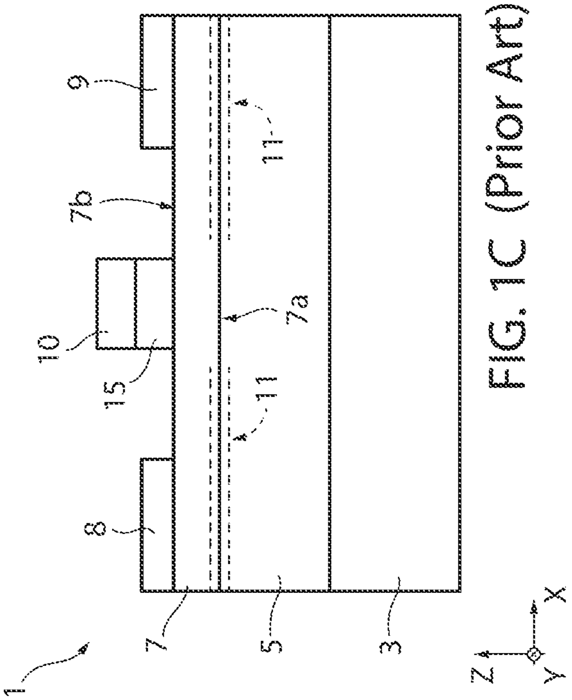
FIG. 1C (Prior Art)
Figure 1D:
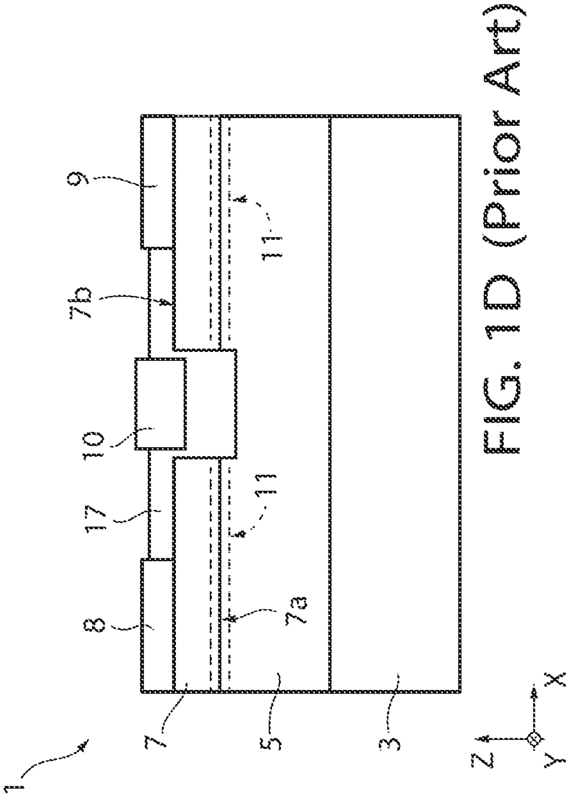
FIG. 1D (Prior Art)
Figure 2:
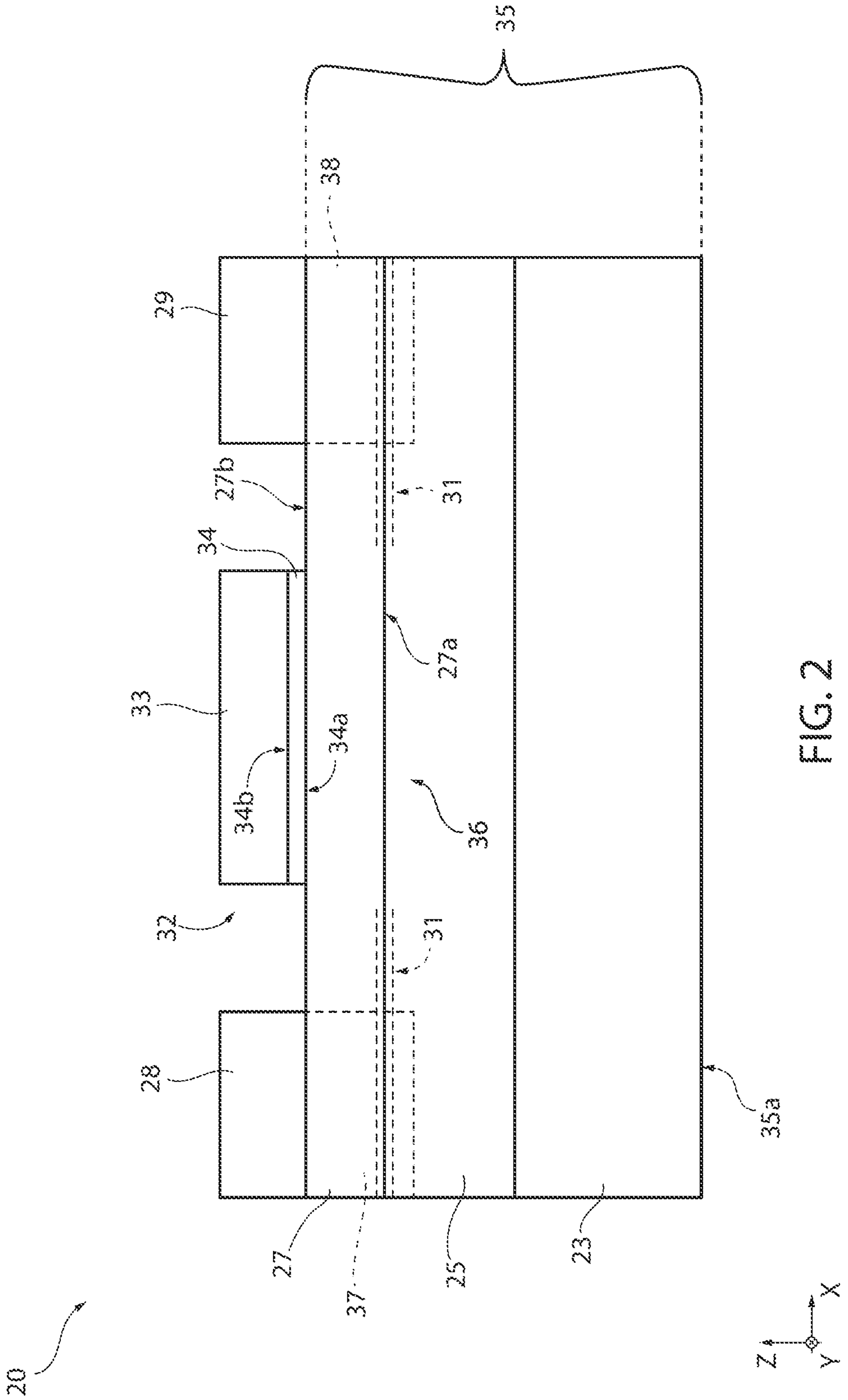
FIG. 2 shows a lateral cross-section view of a HEMT, according to an embodiment.

FIG. 2 shows a high-electron-mobility transistor (HEMT) device 20, according to one embodiment. FIG. 2 is a lateral cross-section view (i.e., on an XZ plane defined by the X and Z axes) of the HEMT device 20. FIG. 2 illustrates elements useful to understand the present embodiment. Though not shown, other elements or components may also be present in the finished HEMT device 20 without departing from the scope of the present disclosure.

The HEMT device 20 (hereinafter also more simply referred to as HEMT 20) includes, superimposed on each other along the Z axis: a substrate 23 of semiconductor material (e.g., silicon or silicon carbide, SiC, or sapphire); a first structural layer 25 (or channel layer 25 of the HEMT 20), in particular of gallium nitride (GaN), grown for example through epitaxy on the substrate 23; and a second structural layer 27 (or barrier layer 27 of the HEMT 20), in particular of aluminum gallium nitride (AlGaN) or, more generally, of compounds based on ternary or quaternary alloys of gallium nitride, such as AlxGa1-xN, AlInGaN, InxGa1-xN, AlxIn1-xAl, grown for example through epitaxy on the channel layer 25.

In detail, the barrier layer 27 has a bottom surface **27*a* facing the channel layer 25 and a top surface 27*b* opposite to the bottom surface 27*a*** with respect to the Z axis.

The channel layer 25 and the barrier layer 27 form, in a manner known per se, a heterostructure for generating a two-dimensional electron gas (2DEG, indicated in FIG. 2 with the reference 31). In detail, the 2DEG 31 is formed at the interface between the channel layer 25 and the barrier layer 27, i.e., at the bottom surface **27*a* of the barrier layer 27**. In other words, the charge carriers belonging to the 2DEG are free to move in any direction in an XY plane (defined by the X and Y axes) at said interface, while they are confined along the Z axis.

In a manner not shown in figure, one or more further buffer layers of a known type may optionally be present between the substrate 23 and the channel layer 25, as needed.

For purely illustrative and non-limiting purposes, the channel layer 25 has a thickness along the Z axis comprised for example between about 1 μm and 5 μm and a doping density comprised between about $10^{14}$ at/$cm^3$ and about $10^{16}$ at/$cm^3$, the barrier layer 27 has a thickness (along the Z axis) comprised for example between about 5 nm and 30 nm and a doping density lower than about $10^{17}$ at/$cm^3$.

Optionally, the HEMT 20 also includes a passivation layer (shown in FIG. 6I with the reference 42) extending on the top surface **27*b* of the barrier layer 27 and having the function of protecting the barrier layer 27 from oxidative phenomena. The passivation layer 42** is of passivating material, such as $Al_2O_3$, and has a thickness along the Z axis comprised for example between about 20 nm and 100 nm.

The substrate 23, the channel layer 25 and the barrier layer 27 form a semiconductor body 35 of the HEMT 20, including said heterostructure. The semiconductor body 35 has a top surface formed by the top surface **27*b* of the barrier layer 27 (and therefore indicated hereinafter with the same reference number) and a bottom surface opposite to the top surface 27*b* along the axis Z and indicated in FIG. 2 with the reference 35*a***.

In detail, the HEMT 20 optionally further includes a source contact 28 and a drain contact 29, of conductive material (e.g., metal such as gold or platinum or Ti/Al/Ni/Au metal multilayer subject to thermal processes at high temperatures, e.g., at about 800° C.), physically decoupled from each other and extending on the top surface **27*b* of the barrier layer 27, in electrical contact with the barrier layer 27**.

For example, a source region 37 and a drain region 38 (optional) extend into the barrier layer 27 from the top surface 27*b* towards the bottom surface 27*a*. For example, the source region 37 and the drain region 38 extend along the Z axis through the barrier layer 27 (i.e., until reaching the bottom surface 27*a*) and, partially, also into the channel layer 25. The source region 37 and the drain region 38 are spaced from each other by part of the barrier layer 27. The source contact 28 and the drain contact 29 are vertically superimposed (along the Z axis) on the source region 37 and, respectively, on the drain region 38, and are in electrical connection with the latter through, for example, ohmic contacts (not shown). In particular, the source region 37 and the drain region 38 have N-type conductivity and are formed for example by implanting doping species within the barrier layer 27.

Furthermore, the HEMT 20 includes a gate structure 32 biasable (e.g., by an external bias circuit) to electrically control the 2DEG 31. The gate structure 32 extends on the top surface 27*b* of the barrier layer 27, between the source contact 28 and the drain contact 29 (at a distance from the latter). The gate structure 32 includes a functional layer (or 2D layer) 34 and a gate contact 33.

In particular, a gate voltage $V_G$ is applicable to the gate structure 32 (in detail to the gate contact 33) in such a way that when it is lower than a gate threshold voltage (e.g., greater than about 1 V and for example comprised between about 1 V and about 2 V) the 2DEG 31 is not present in the region, vertically aligned (along the Z axis) with the gate structure 32, of the interface between the channel layer 25 and the barrier layer 27, and when it is greater than, or equal to, the gate threshold voltage the 2DEG 31 is present in said region of the interface vertically aligned with the gate structure 32 (also called 2DEG activation region and indicated in FIG. 2 with the reference 36). The absence of 2DEG 31 in the 2DEG activation region 36 arranged underneath the gate structure 32 is caused by the functional layer 34 which modifies the energy of the electrons present there, locally preventing the formation of the potential well and therefore the accumulation of electrons, as better described hereinafter.

The functional layer 34 extends on part of the top surface 27*b* of the barrier layer 27, in particular between the source contact 28 and the drain contact 29 so as not to be in physical and electrical contact with the latter, and the gate contact 33 is of conductive material (e.g., metal such as gold or platinum) and is in physical and electrical contact with the functional layer 34.

The functional layer 34 is of two-dimensional semiconductor material, in particular of transition-metal dichalcogenide such as $MoS_2$, $MoSe_2$, $MoTe_2$, $WS_2$ or $WSe_2$. Although in the following the transition-metal dicalcogenides and in particular the molybdenum disulfide, $MoS_2$ (the latter for purely illustrative purposes) are considered, other two-dimensional semiconductor materials might similarly be used, such as Xenes (phosphorene, antimonene, arsenene, tellurene, selenene, etc.) and 2D nitrides (2D-GaN, 2D-InN, 2D-AlN).

In the embodiment of FIG. 2, the functional layer 34 has P-type electrical conductivity, for example with a doping density comprised between $10^{19}$ at/cm$^3$ and about $10^{20}$ at/cm$^3$. For instance, the doping of the functional layer 34 is provided through doping species such as niobium (Nb) or zinc (Zn) or through plasma functionalization (e.g., oxygen plasma), as better described hereinafter.

In particular, the functional layer 34 is formed by a monolayer or by a layered structure (or multilayer) of transition-metal dicalcogenide. In the case of layered structure, the functional layer 34 includes a plurality of layers (monolayers) of transition-metal dicalcogenide superimposed on each other (i.e., each layer extends parallel to the XY plane and the layers are mutually superimposed along the Z axis); in detail, the number of transition-metal dicalcogenide monolayers superimposed on each other is lower than, or equal to, a threshold number of layers (dependent on the transition-metal dicalcogenide used and, for example, equal to five layers for $MoS_2$), in order to ensure the enhancement-mode behavior of the HEMT 20.

According to an exemplary embodiment, the functional layer 34 of the HEMT 20 is formed by a monolayer of $MoS_2$ with P-type electrical conductivity and with a doping density $N_A$ equal to about $1 \cdot 10^{19}$ cm$^{-3}$ and the barrier layer 27 of the HEMT 20 has a thickness (measured along the Z axis, between the top surface 27*b* and the bottom surface 27*a*) comprised between about 8 nm and about 12 nm and has an aluminum concentration comprised between about 12% and about 18%. For instance, considering an aluminum concentration in the barrier layer 27 equal to about 14%: for a thickness of the barrier layer equal to about 8 nm, the functional layer 34 is formed by one or two layers of $MoS_2$ with $N_A > 10^{19}$ cm$^{-3}$; and for a thickness of the barrier layer equal to about 12 nm, the functional layer 34 is formed by a layer of $MoS_2$ with $N_A > 10^{19}$ cm$^{-3}$ or by two layers of $MoS_2$ with $N_A > 10^{20}$ cm$^{-3}$.

In the embodiment of FIG. 2, the gate contact 33 extends on the functional layer 34 and both the functional layer 34 and the gate contact 33 extend, along the X axis, between the source contact 28 and the drain contact 29 (at a distance from the latter). In detail, the functional layer 34 is interposed, along the Z axis, between the gate contact 33 and the barrier layer 27, in particular so as to physically separate the gate contact 33 and the barrier layer 27 from each other. In other words, the functional layer 34 has a first surface 34*a* and a second surface 34*b* opposite to each other along the Z axis; the barrier layer 27 is in contact with the first surface 34*a* of the functional layer 34 and the gate contact 33 is in contact with the second surface 34*b* of the functional layer 34.

Figure 3:
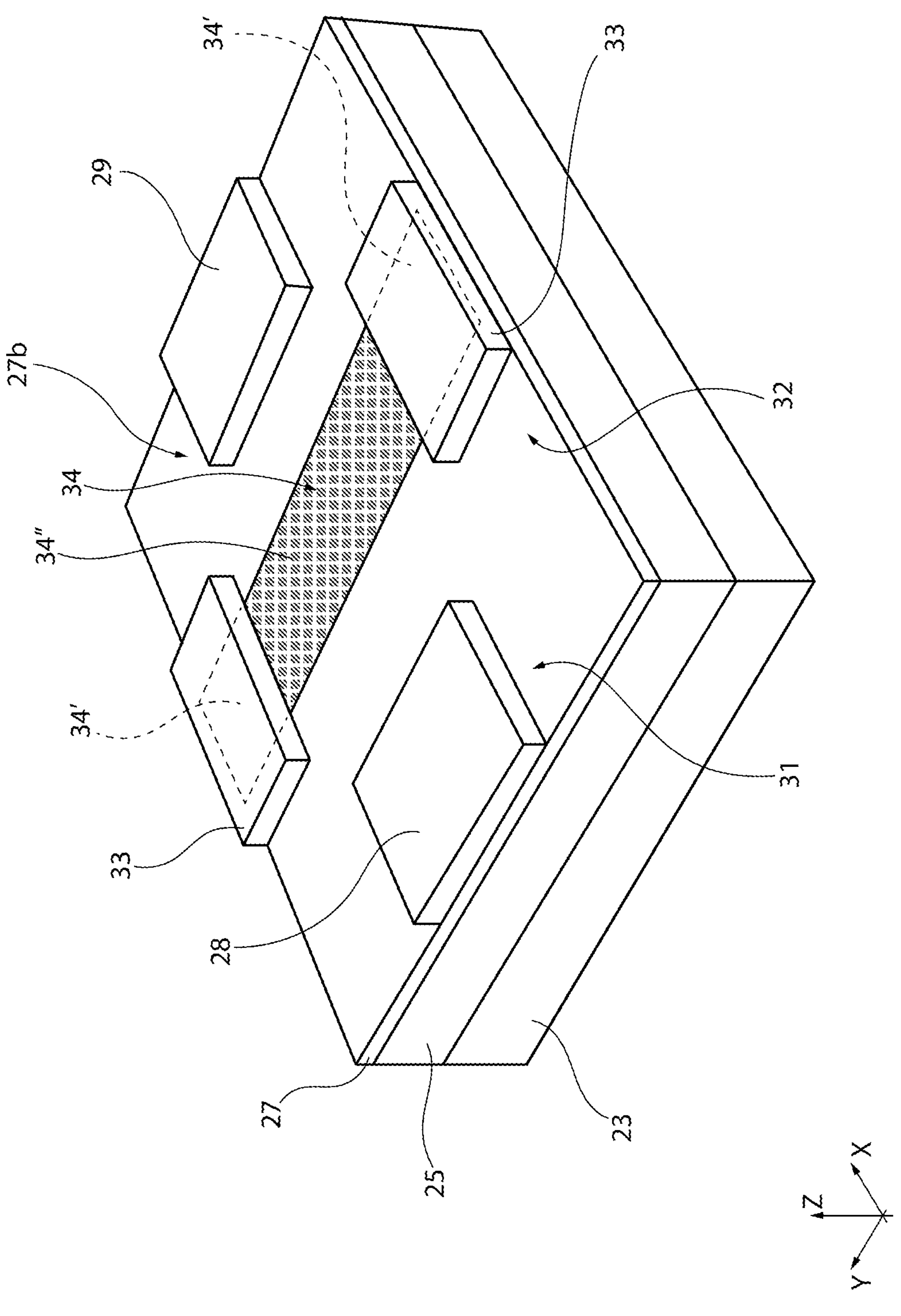
FIG. 3 shows a schematic perspective view of a HEMT, according to an embodiment.

FIG. 3 shows, in perspective view, a different embodiment of the HEMT 20, similar to that shown in FIG. 2 but wherein the gate contact 33 extends on regions of the functional layer 34 (hereinafter referred to as first regions and indicated in figure with the reference 34') which, along the X axis, do not extend between the source contact 28 and the drain contact 29. In other words, the functional layer 34 includes two first regions 34' and a second region 34" interposed, along the Y axis, between the first regions 34'; the second region 34" extends, along the X axis, between the source contact 28 and the drain contact 29 (without being in direct physical and electrical contact with the latter) and the first regions 34' are not comprised, along the X axis, between the source contact 28 and the drain contact 29.

Figure 6B:
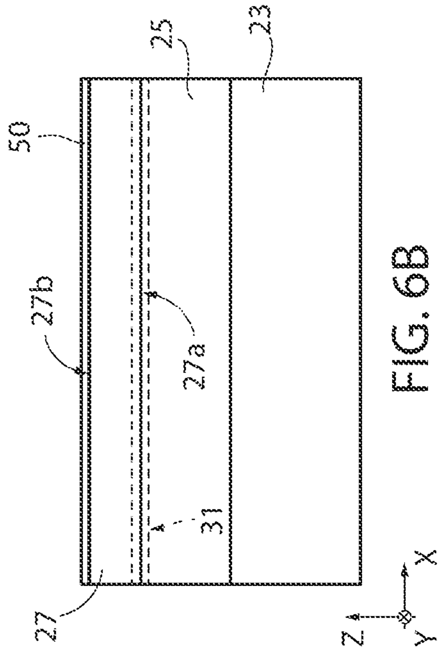
FIGS. 6A-6I show, in lateral cross-section view, manufacturing steps of a HEMT, according to an embodiment.
Figure 6D:
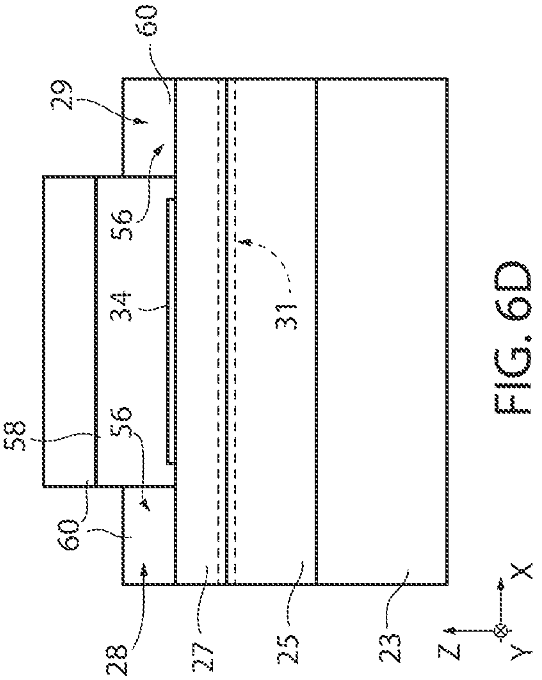
Figure 6A:
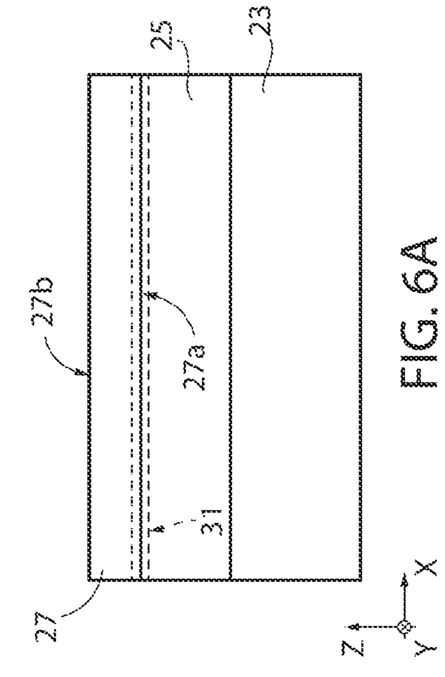
Figure 6C:
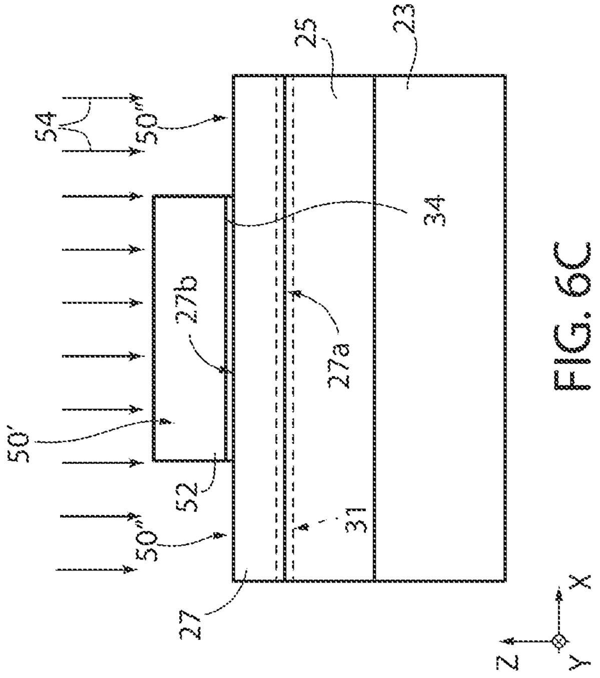
Figure 6F:
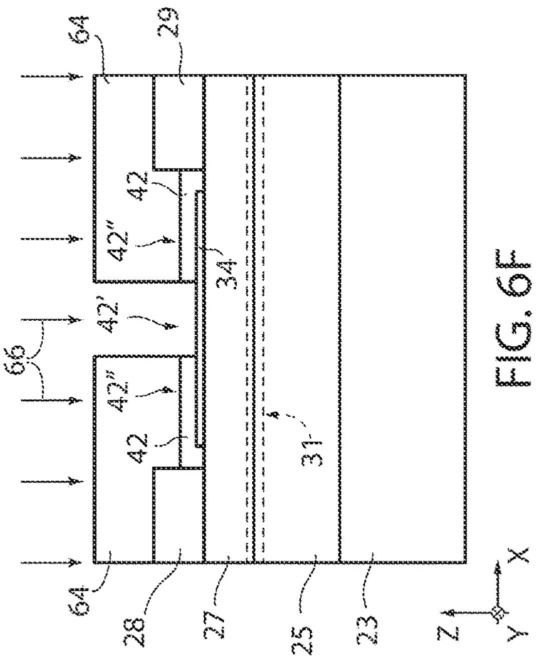
Figure 6H:
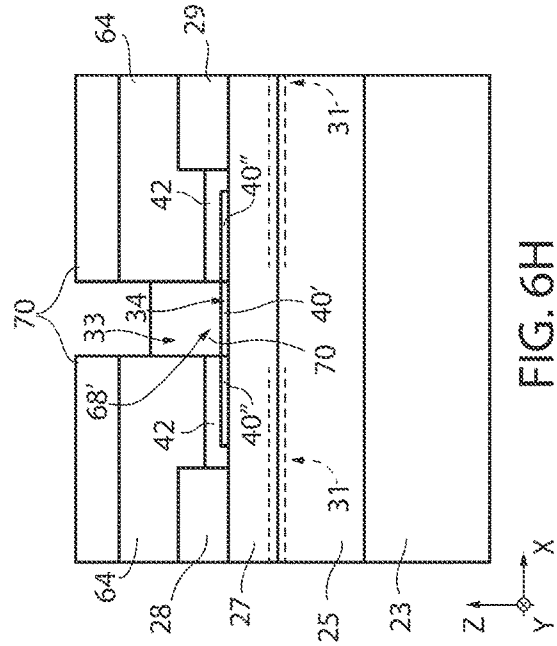
Figure 6E:
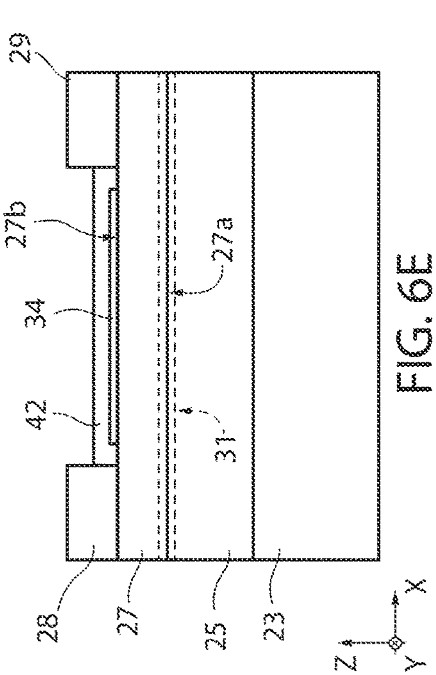
Figure 6G:
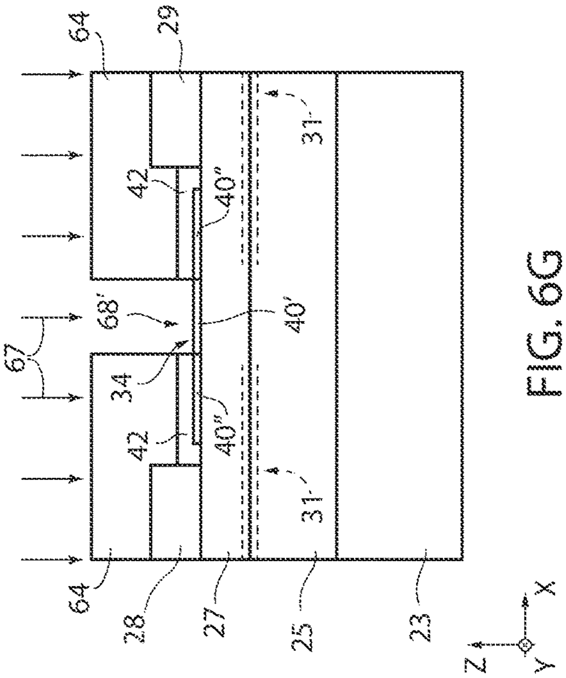
Figure 6I:
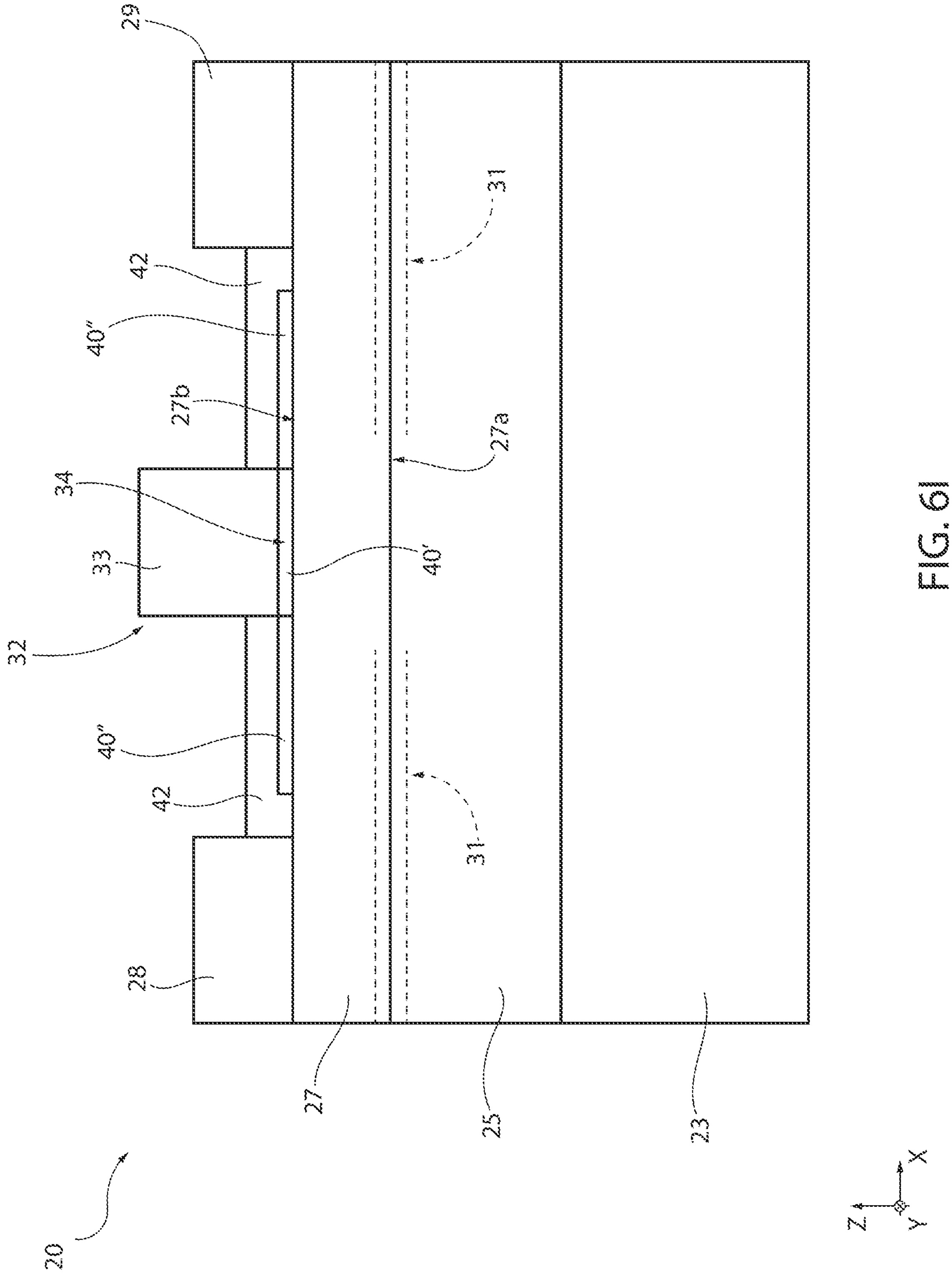

Moreover, as shown in FIG. 6I and better described hereinafter, the functional layer 34 may not have P-type electrical conductivity throughout its extension. In this case, the functional layer 34 includes a first doped portion 40' and two second doped portions 40" extending, along the X axis, on opposite sides from each other of the first doped portion 40'; in other words, the first doped portion 40' is comprised and interposed, along the X axis, between the second doped portions 40". In particular, the gate contact 33 extends only on the first doped portion 40' (therefore it is not vertically superimposed along the Z axis on the second doped portions 40").

The first doped portion 40' has P-type electrical conductivity, for example with a doping density comprised between about $10^{19}$ at/cm$^3$ and about $10^{20}$ at/cm$^3$, and the second doped portions 40" have N-type electrical conductivity, for example with doping density comprised between about $10^{15}$ at/cm$^3$ and about $10^{17}$ at/cm$^3$.

In other words, the part of the functional layer 34 which is vertically aligned, along the Z axis, with the gate contact 33 has P-type electrical conductivity while the parts of the functional layer 34 which are not vertically aligned, along the Z axis, with the gate contact 33 have N-type electrical conductivity.

In other words, in the embodiments of FIGS. 2 and 3 the functional layer 34 of the HEMT 20 is formed only by said first doped portion 40' of P-type, while in the embodiment of FIG. 6I includes both the first doped portion 40' of P-type and the second doped portions 40" of N-type. In the case of FIG. 6I, the 2DEG activation region 36 is aligned, along the Z axis, with the first doped portion 40', i.e., its extension in the XY plane is defined by the first doped portion 40'.

Figure 4:
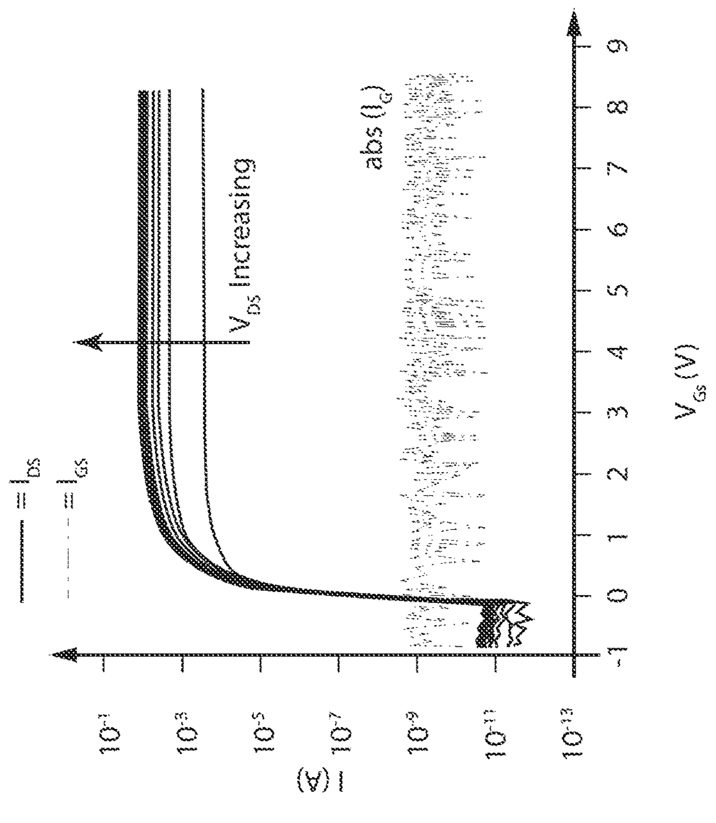
FIG. 4 shows a graph that illustrates electrical properties of the HEMT of FIG. 2, according to an embodiment.

FIG. 4 shows, for purely illustrative and non-limiting purposes, examples of both the transconductance $I_{DS}$-$V_{GS}$ of the HEMT 20, where $I_{DS}$ is the drain current (measured between the drain contact 29 and the source contact 28) and $V_{GS}$ is the gate voltage (applied between the gate contact 33 and the source contact 28), and of the trend of the gate current $I_{GS}$ (measured between the gate contact 33 and the source contact 28) of the HEMT 20 as a function of the gate voltage $V_{GS}$. As may be seen, the HEMT 20 is in an off-state for $V_{GS} \leq 0$ V and is in an on-state for $V_{GS} > 0$ V (in detail, it has $I_{DS}$ of the order of magnitude of about $1 \cdot 10^{-11}$ A for $V_{GS} \leq 0$ V and has $I_{DS}$ of the order of magnitude of about $1 \cdot 10^{-4}$ A for $V_{GS} > 0$ V, where $I_{DS}$ has a value that increases to $V_{GS} > 0$ V as the value of the drain voltage $V_D$S, applied between the drain contact 29 and the source contact 28 and for example variable in FIG. 4 between about 0.1 V and 3.1 V increases). Moreover, the gate current $I_{GS}$ is of the order of magnitude of about $1 \cdot 10^{-10}$ A for $V_{GS}$ comprised for example between about −1 V and 9 V.

Figure 5:
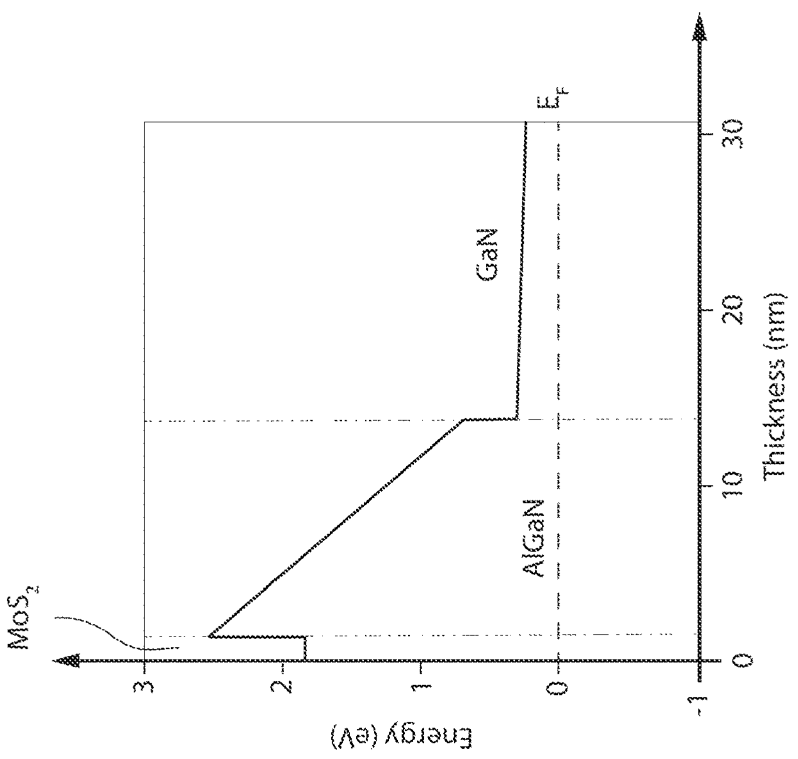
FIG. 5 shows a band diagram of the HEMT of FIG. 2, according to an embodiment.

FIG. 5 shows, at $V_{GS}=0$ V, a band diagram (or structures) of the HEMT 20 according to an exemplary embodiment of the latter. In detail, the band diagram shows the energy of an electron present in the HEMT 20 as a function of a thickness of the same HEMT 20, measured along the Z axis from the second surface 34*b* of the functional layer 34 towards the substrate 23, through the 2DEG activation region 36. In particular, the example illustrated in FIG. 5 refers to a HEMT 20 which has a monolayer of $MoS_2$ (with energy gap equal to about 1.9 eV, with thickness along the Z axis equal to about 0.65 nm and with a dopant concentration $N_A$ equal to about $1 \cdot 10^{19}$ cm$^{-3}$), an aluminum concentration in the barrier layer 27 equal to about 14% and a thickness along the Z axis of the barrier layer 27 equal to about 12 nm: as noted, this HEMT 20 is an enhancement-mode HEMT as it is in the off-state at null $V_{GS}$, and in particular the energy of the electrons is greater than the Fermi level $E_F$ of the HEMT 20 at the interface between the barrier layer 27 and the channel layer 25 (i.e., the 2DEG 31 does not generate below the functional layer 34 at $V_{GS}=0$ V).

FIGS. 6A-6I illustrate, in lateral cross-section view, steps of an embodiment of a manufacturing process of the HEMT 20. In particular, for illustrative and non-limiting purposes, the manufacturing process is described with reference to the embodiment of the HEMT 20 shown in FIG. 6I, wherein the functional layer 34 includes the first doped portion 40' of P-type and the second doped portions 40" of N-type.

With reference to FIG. 6A, the substrate 23 of semiconductor material, such as for example silicon or silicon carbide (SiC), or sapphire ($Al_2O_3$) or other, is arranged. Above the substrate 23 there are formed in succession and in a manner known per se, along the Z axis, respectively: the channel layer 25, in particular of gallium nitride (GaN), grown for example through epitaxy on the substrate 23; and the barrier layer 27, in particular of aluminum gallium nitride (AlGaN) or, more generally, of compounds based on ternary, quaternary alloys of gallium nitride, such as $Al_xGa_{1-x}N$, AlInGaN, $In_xGa_{1-x}N$, $Al_xIn_{1-x}Al$, grown for example through epitaxy on the channel layer 25. The channel layer 25 and the barrier layer 27 form, in a manner known per se, a heterostructure wherein the 2DEG 31 is formed. In a manner not shown in figure, one or more buffer layers may be formed in a manner known per se (e.g., epitaxially grown on the substrate 23 before forming, on the one or more buffer layers, the channel layer 25), between the substrate 23 and the channel layer 25, as needed. By way of example, the channel layer 23 has a thickness along the Z axis for example comprised between about 1 μm and 5 μm and the barrier layer 27 has a thickness along the Z axis for example comprised between about 5 nm and 30 nm.

With reference to FIG. 6B, a two-dimensional semiconductor layer 50 of two-dimensional semiconductor, in particular of transition-metal dichalcogenide such as $MoS_2$, $MoSe_2$, $MoTe_2$, $WS_2$ or $WSe_2$ is formed on the barrier layer 27 (i.e., on the top surface 27*b*, in particular so as to entirely and uniformly cover the entire top surface 27*b*). Although in the following the transition-metal dicalcogenides and in particular $MoS_2$ (the latter for purely illustrative purposes) are considered, other two-dimensional semiconductor materials may similarly be used, such as Xenes (phosphorene, antimonene, arsenene, tellurene, selenene, . . . ) and 2D nitrides (2D-GaN, 2D-InN, 2D-AlN). The two-dimensional semiconductor layer 50 is intended to form the functional layer 34. The two-dimensional semiconductor layer 50, exemplarily considered of $MoS_2$ in the following, is formed on the barrier layer 27 by deposition and intrinsically has N-type electrical conductivity. In other words, the N-type electrical conductivity of the two-dimensional semiconductor layer 50 is not intentionally obtained but results, as is known, from the $MoS_2$ deposition technique used. In detail, the formation of the two-dimensional semiconductor layer 50 on the barrier layer 27 is carried out through deposition techniques such as chemical vapor deposition (CVD); further details in this regard are present in the prior art paper D. Ruzmetov, et al., "Vertical 2D/3D Semiconductor Heterostructures Based on Epitaxial Molybdenum Disulfide and Gallium Nitride," ACS Nano 10, 3580-3588 (2016)), molecular-beam epitaxy (MBE) or pulsed laser deposition (PLD); further details in this regard are present in the prior art paper S. Chromik, et al., "Influence of GaN/AlGaN/GaN (0001) and Si (100) substrates on structural properties of extremely thin MoS2 films grown by pulsed laser deposition," Appl. Surf Sci. 395, 232-236 (2017)). More specifically, this deposition is done without adding doping species, and therefore in an intrinsic manner. In the exemplarily considered embodiment, the formation of the two-dimensional semiconductor layer 50 includes the deposition on the barrier layer 27 of a $MoS_2$ layer (monolayer); however, further embodiments may include the deposition on the barrier layer 27 of multiple layers of $MoS_2$, superimposed on each other along the Z axis.

With reference to FIG. 6C, the two-dimensional semiconductor layer 50 is defined through a first etching (indicated in the figure with arrows and with the reference number 54)

to form the functional layer 34. In detail, the first etching 54 is a plasma etching, in particular chlorine-based plasma (further details in this regard are present in the prior art paper F. Ghasemi, et al., "Controlled Plasma Thinning of Bulk $MoS_2$ Flakes for Photodetector Fabrication," ACS Omega 4, 19693-19704 (2019)). For example, the first etching 54 is of a layer-by-layer controlled type.

In greater detail, the formation of the functional layer 34 from the two-dimensional semiconductor layer 50 is performed through known lithographic steps followed by the first etching 54. In particular, a deposition of a first photoresist layer 52 (with a suitable thickness in view of the first etching 54, for example between 1 and 3 μm) is performed on the two-dimensional semiconductor layer 50, through known lithographic techniques. The first photoresist layer 52 operates as a first mask and is such that it covers a first region 50' of the two-dimensional semiconductor layer 50 and leaves exposed second regions 50" of the two-dimensional semiconductor layer 50, lateral to the first region 50'. The first region 50' of the two-dimensional semiconductor layer 50 forms the functional layer 34 while the second regions 50" define the regions wherein the source contact 28, the drain contact 29 and, optionally, part of the passivation layer 42 will be manufactured. The method proceeds therefore with the first etching 54 to selectively remove the second regions 50" of the two-dimensional semiconductor layer 50, leaving instead the first region 50' of the two-dimensional semiconductor layer 50 and thus forming the functional layer 34. The first photoresist layer 52 is then removed, in a per se known manner, exposing the second surface 34*b* of the functional layer 34.

With reference to FIG. 6D, the source region 37 and the drain region 38 are formed in the barrier layer 27 (optional, in a manner known per se and not shown) and subsequently the source contact 28 and the drain contact 29 (optional) are formed on the source region 37 and, respectively, on the drain region 38. The source region 37 and the drain region 38 are formed for example through lithographic steps which, through a second photoresist layer 58 used as a second mask, leave exposed regions of the top surface 27*b* of the barrier layer 27 not covered by the functional layer 34 (indicated in FIG. 6D with the reference 56) and, subsequently, through implant (not shown) of doping species at said exposed regions 56 of the top surface 27*b* of the barrier layer 27, followed by a thermal process (e.g., annealing) to favor the diffusion of the doping species. The source contact 28 and the drain contact 29 are provided using again the second photoresist layer 56 as a second mask, so as to be vertically aligned (along the Z axis) with the source region 37 and, respectively, with the drain region 38 and not to be in direct physical contact with the functional layer 34. For instance, the source contact 28 and the drain contact 29 are formed through deposition of a first metal layer (or source and drain metal layer) 60 (e.g., gold or platinum, through techniques such as sputtering, CVD or MBE; the first metal layer 60 may also include a stack of metal layers such as a first layer of titanium to improve adhesion and one or more layers of gold or platinum superimposed thereon) on said exposed regions 56 of the top surface 27*b* and on the second photoresist layer 56 and, subsequently, through lift-off of the second photoresist layer 56 so as to leave portions of the first metal layer 60 which form the source contact 28 and the drain contact 29. Otherwise, in case the source region 37 and the drain region 38 are absent, a different approach may include the deposition of the first metal layer 60 on the exposed regions 56 of the top surface 27*b* and on the second photoresist layer 56, using the second photoresist layer 56 as a second mask, followed by a thermal process (in inert gas, for example at temperatures of about 800° C.) which leads to the formation of the source and drain contacts 28, 29 and by the lift-off of the second photoresist layer 56.

With reference to FIG. 6E, the passivation layer 42 (optional) is formed on the functional layer 34 and on the parts of the top surface 27*b* not covered by the functional layer 34 or the source contact 28 or the drain contact 29. The passivation layer 42 protects the barrier layer 27 from oxidative phenomena and improves the electrical decoupling of the gate structure 32 from the source and gate contacts 28, 29. For instance, this occurs by depositing passivating material (e.g., $Al_2O_3$). In detail, a third photoresist layer (not shown) is formed on the source contact 28 and on the drain contact 29 so as to leave exposed the functional layer 34 and part of the top surface 27*b* of the barrier layer 27 (in other words, the third photoresist layer has a shape complementary to the second photoresist layer 56), the passivating material is deposited on the third photoresist layer (for example through atomic layer deposition, ALD), on the functional layer 34 and on the exposed part of the top surface 27*b* of the barrier layer 27, and the third photoresist layer is removed through lift-off, thus defining the passivation layer 42.

With reference to FIG. 6F, a first portion of the passivation layer 42 is removed, vertically superimposed (along the Z axis) on the region of the functional layer 34 for forming the first portion 40' of the functional layer 34 (hereinafter also referred to as first region of the functional layer 34 and shown in FIG. 6G with the reference 68'). In particular, this occurs by forming a gate photoresist layer 64 on the source and gate contacts 28, 29 and on second regions 42" of the passivation layer 42, leaving instead exposed a first region 42' of the passivation layer 42 which is vertically superimposed (along the Z axis) on the first region 68' of the functional layer 34. The second regions 42" of the passivation layer 42 have a shape complementary to the first region 42' of the passivation layer 42 and therefore extend both on the parts of the functional layer 34 for forming the second doped portions 40" of the functional layer 34 and on the parts of the functional layer 34 in direct contact with the barrier layer 27. Following the formation of the gate photoresist layer 64, a second etching is performed (in detail wet etching for example through NaOH or BOE, indicated in FIG. 6F with arrows and the reference 66) at the first region 42' of the passivation layer 42 left exposed by the gate photoresist layer 64. The second etching 66 selectively removes the first portion of the passivation layer 42, exposing the first region 68' of the functional layer 34.

With reference to FIG. 6G, the first doped portion 40' of P-type of the functional layer 34 is provided. In other words, the functional layer 34 is doped at its first region 68' so as to have P-type electrical conductivity where it is exposed by the gate photoresist layer 64. This is provided through exposure (shown in the figure with arrows and indicated with the reference 67) of the first region 68' of the functional layer 34 to plasma (doping plasma), in particular oxygen plasma, which allows its functionalization performed selectively through the gate photoresist layer 64. In fact, the oxygen plasma reacts chemically with the $MoS_2$ of the functional layer 34, at its first region 68', and modifies the electrical conductivity thereof making it of P-type (e.g., with doping density $N_A$ equal to about $1 \cdot 10^{19}$ $cm^{-3}$, as a function of the time of exposure of the functional layer 34 to oxygen plasma); in particular, exposure to oxygen plasma occurs at low argon's powers and percentages not to etch the functional layer 34 but only to allow the doping thereof. The gate photoresist layer 64 and the passivation layer 42, on the other hand, prevent the oxygen plasma from reacting with the second doped portions 40" of the functional layer 34, which therefore continue to have N-type electrical conductivity. For instance, the plasma is generated at powers comprised between about 50 W and about 200 W and with a gas composition including about 70-80% of oxygen and 30-20% of argon, at a pressure of about $1 \cdot 10^{-3}$ mbar. Further details regarding the functionalization through oxygen plasma may be found in the paper F. Giannazzo, G. Fisichella, G. Greco, S. Di Franco, I. Deretzis, A. La Magna, C. Bongiorno, G. Nicotra, C. Spinella, M. Scopelliti, B. Pignataro, S. Agnello, F. Roccaforte, "Ambipolar MoS2 Transistors by Nanoscale Tailoring of Schottky Barrier Using Oxygen Plasma Functionalization," ACS Appl. Mater. Interfaces 9, 23164-23174 (2017) or in the paper J. Jadwiszczak, et al, "Plasma Treatment of Ultrathin Layered Semiconductors for Electronic Device Applications," ACS Appl. Electron. Mater. 2021. DOI: 10.1021/acsaelm.0c00901.

With reference to FIG. 6H, the gate contact 33 which defines, together with the functional layer 34, the gate structure 32, is formed on the first doped portion 40' of the functional layer 34. In particular, a second metal layer (or gate conductive layer) 70 is deposited by using the gate photoresist layer 64 as a mask. The second metal layer 70 is of conductive material such as metal, for example gold or platinum, and is formed with deposition techniques such as sputtering, CVD or MBE. For instance, the second metal layer 70 may include a stack of metal layers (e.g., a first layer of titanium to improve adhesion and one or more layers of gold or platinum superimposed thereon). In detail, a first portion of the second metal layer 70 is formed on the gate photoresist layer 64 and a second portion of the second metal layer 70 is formed on the first doped portion 40' of the functional layer 34 (i.e., at the first region 68'). Following this, a lift-off of the gate photoresist layer 64 is performed so as to remove both the gate photoresist layer 64 and the first portion of the second metal layer 70 superimposed thereon and to leave the second portion of the gate photoresist layer 64 which forms the gate contact 33. Owing to the use of the gate photoresist layer 64 both for the P-type doping of the first doped portion 40' of the functional layer 34 and for the deposition of the gate contact 33, the latter is automatically vertically aligned (along the Z axis) with the first doped portion 40' of the functional layer 34.

At the end of the lift-off procedure of the gate photoresist layer 64, the HEMT 20 shown in FIG. 6I is obtained.

There may optionally follow other manufacturing steps (e.g., formations of further dielectric, passivating layers or of metallizations) of a known type and not of interest for the purposes of the present disclosure, which therefore are not described in detail herein.

Moreover, although the manufacturing process shown in FIGS. 6A-6I has been described with reference to the embodiment wherein the functional layer 34 includes the first doped portion 40' of P-type and the second doped portions 40" of N-type, it is evidently applicable in a similar manner also to the embodiment of the HEMT 20 wherein the second doped portions 40" of N-type are absent. In this case the first photoresist layer 52 covers only the portion of the two-dimensional semiconductor layer 50 for forming the functional layer 34 of P-type and the doping step described with reference to FIG. 6G is performed throughout the functional layer 34 (which is entirely exposed by the passivation layer 42 and by the gate photoresist layer 64).

FIGS. 7A-7H illustrate, in a lateral cross-section view, steps of a different embodiment of the manufacturing process of the HEMT 20. In particular, for illustrative and non-limiting purposes, the manufacturing process is described with reference to the embodiment of the HEMT 20 shown in FIG. 2, wherein the functional layer 34 has entirely P-type electrical conductivity.

Figures 7A, 7B, 7C, 7D:
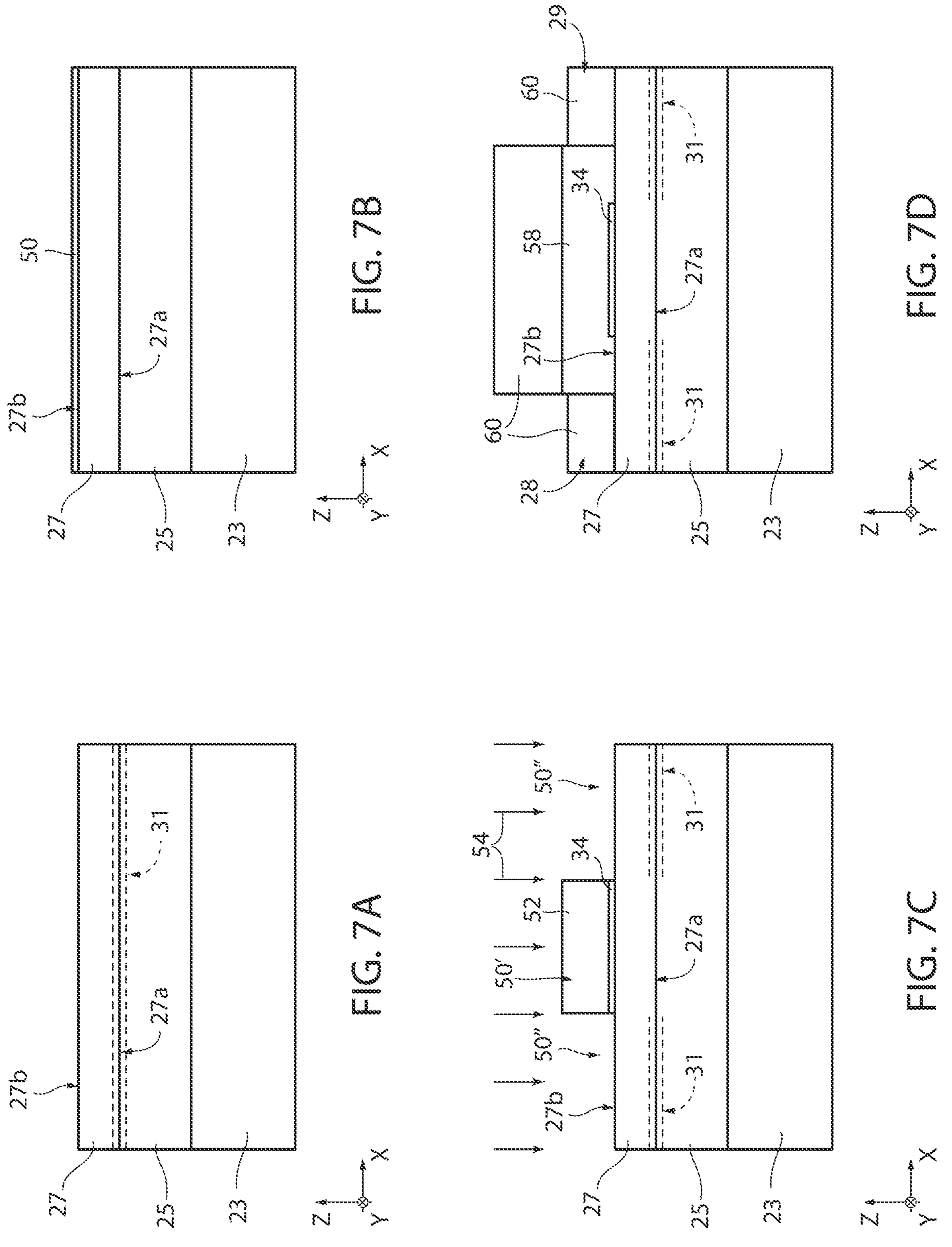
FIGS. 7A-7H show, in lateral cross-section view, manufacturing steps of the HEMT of FIG. 2, according to an embodiment.

With reference to FIG. 7A, the substrate 23 is arranged and, above the latter, the channel layer 25 and the barrier layer 27, respectively, are formed in succession along the Z axis, as previously described with reference to FIG. 6A.

With reference to FIG. 7B, the two-dimensional semiconductor layer 50 of two-dimensional semiconductor, in particular of transition-metal dichalcogenide such as $MoS_2$, $MoSe_2$, $MoTe_2$, $WS_2$ or $WSe_2$ is formed on the barrier layer 27 (i.e., on the top surface **27*b*, in particular so as to entirely and uniformly cover the entire top surface 27*b*). Although in the following the transition-metal dicalcogenides and in particular $MoS_2$ (the latter for purely illustrative purposes) are considered, other two-dimensional semiconductor materials may similarly be used, such as Xenes (phosphorene, antimonene, arsenene, tellurene, selenene, . . . ) and 2D nitrides (2D-GaN, 2D-InN, 2D-AlN). The two-dimensional semiconductor layer 50 is intended to form the functional layer 34. The two-dimensional semiconductor layer 50, exemplarily considered of $MoS_2$ in the following, is formed on the barrier layer 27 through deposition in the presence of acceptor-type doping species (e.g., niobium or magnesium), so as to have P-type electrical conductivity. In other words, the P-type electrical conductivity of the two-dimensional semiconductor layer 50 is not intrinsically obtained but results from the addition of acceptor-type doping species during the deposition of $MoS_2$. In detail, the formation of the two-dimensional semiconductor layer 50 on the barrier layer 27 is carried out through deposition techniques such as chemical vapor transport (CVT) in the presence of one or more acceptor-type doping species. For instance, the chemical transport reaction is performed in a tube furnace using vapors emitted from sulfur (S) powders in a crucible heated to about 200° C. and emitted from a mixture of $MoO_3$, $Nb_2O_5$ powders (source of Nb) and NaCl (reaction promoter) in a crucible heated to about 800° C.; the vapors are transported by a carrier gas (Ar) with a flow of about 100 sccm to the sample, set at a temperature of about 800° C., for a duration of about 30 min, so as to obtain the two-dimensional semiconductor layer 50 of $MoS_2$: Nb with doping density $N_A$ equal to about $1 \cdot 10^{19}$ $cm^{-3}$ (greater details in this regard may be found in the paper M. Li, et al., "P-type Doping in Large-Area Monolayer $MoS_2$ by Chemical Vapor Deposition," ACS Appl. Mater. Interfaces 12, 6276-6282 (2020)). In the exemplary considered embodiment, the formation of the two-dimensional semiconductor layer 50 includes the deposition on the barrier layer 27 of a P-type $MoS_2$ layer (monolayer); however, further embodiments may include the deposition, on the barrier layer 27**, of multiple P-type $MoS_2$ layers, superimposed on each other along the Z axis.

With reference to FIG. 7C, the two-dimensional semiconductor layer 50 with P-type conductivity is defined through the first etching 54 (in detail, chlorine-based plasma etching) to form the functional layer 34, as described with reference to FIG. 6C. In particular, the deposition of the first photoresist layer 52 is performed on the two-dimensional semiconductor layer 50 and the first etching 54 is performed to selectively remove the second regions 50" of the two-dimensional semiconductor layer 50, leaving instead the first region 50' of the two-dimensional semiconductor layer 50 so as to form the functional layer 34. The first photoresist layer 52 is then removed.

With reference to FIG. 7D, the source region 37 and the drain region 38 are formed in the barrier layer 27 (in a manner known per se and not shown) and subsequently the source contact 28 and the drain contact 29 are formed on the source region 37 and, respectively, on the drain region 38, as previously described with reference to FIG. 6D.

Figure 7E:
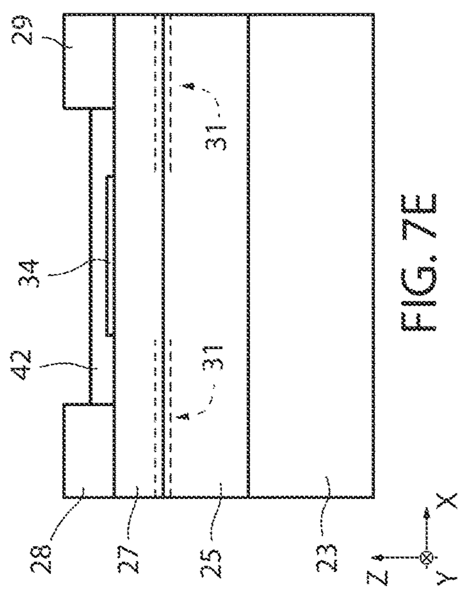

With reference to FIG. 7E, the passivation layer 42 (optional) is formed on the functional layer 34 and on the parts of the top surface 27*b* that are not covered by the functional layer 34 or the source contact 28 or the drain contact 29, as previously described with reference to FIG. 6E.

Figure 7F:
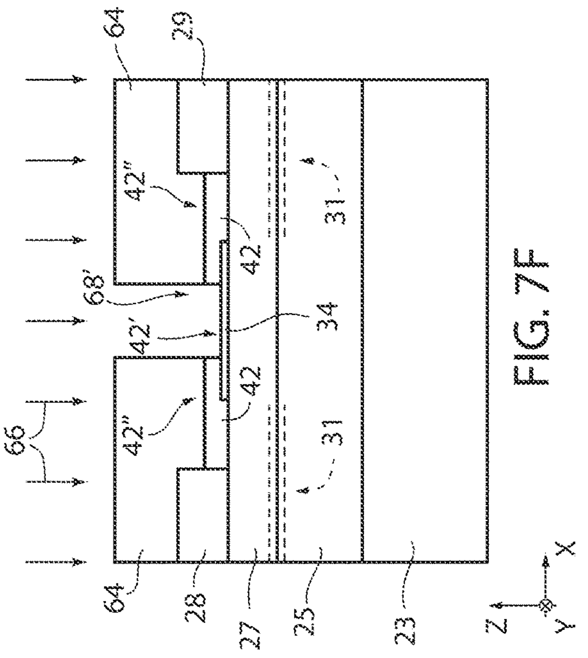

With reference to FIG. 7F, the first portion of the passivation layer 42 is removed to expose the first region 68' of the functional layer 34, as previously described with reference to FIG. 6F. In the present embodiment of the HEMT 20, the first portion of the passivation layer 42 is vertically superimposed (along the Z axis) on part of the functional layer 34 of P-type, whereon the gate contact 33 will extend; alternatively and in a manner not shown, the first portion of the passivation layer 42 may be vertically superimposed (along the Z axis) throughout the functional layer 34 of P-type in such a way that, when removed, the entire functional layer 34 is exposed and the gate contact 33 extends throughout the functional layer 34.

Figure 7G:
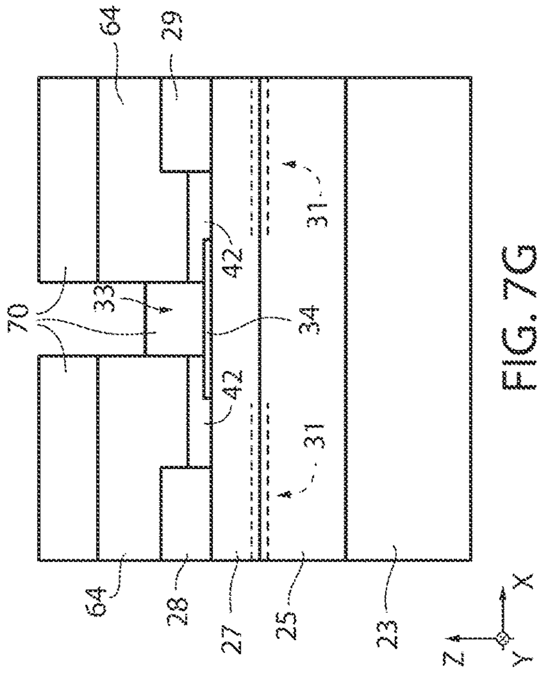

With reference to FIG. 7G and as previously described with reference to FIG. 6H, the gate contact 33 which defines, together with the functional layer 34, the gate structure 32, is formed on the first region 68' of the functional layer 34, exposed. Consequently, the gate contact 33 is formed on part of the functional layer 34 of P-type (alternatively and in a manner not shown, throughout the functional layer 34).

Figure 7H:
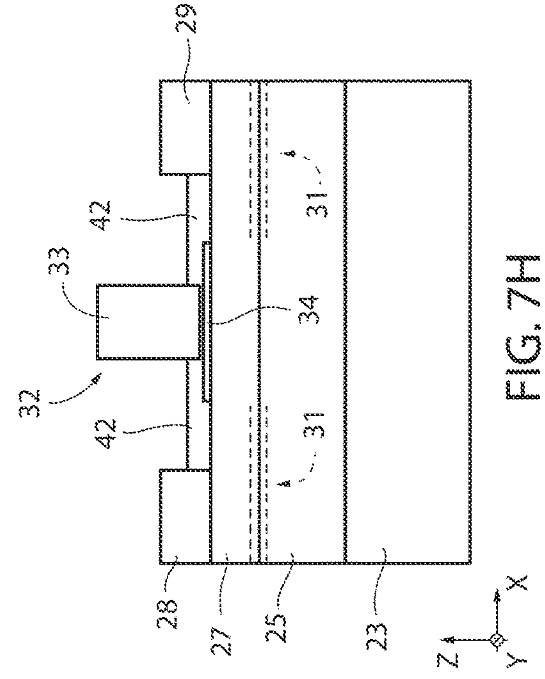

At the end of the lift-off procedure of the gate photoresist layer 64, the HEMT 20 shown in FIG. 7H is obtained.

There may optionally follow other manufacturing steps (e.g., formations of further dielectric, passivating layers or of metallizations) of a known type and not of interest for the purposes of the present disclosure, which therefore are not described in detail herein.

From an examination of the characteristics of the disclosure made according to the present disclosure, the advantages that it affords are evident.

The HEMT 20 operates in enhancement owing to the functional layer 34 of a P-type doped two-dimensional semiconductor (in detail, with high doping concentrations, for example greater than $10^{19}$ $cm^{-3}$) which modifies the energy bands of the electrons at the interface between the channel layer 25 and the barrier layer 27, causing an increase in the minimum of the AlGaN conduction band with respect to the Fermi level and preventing the formation of the potential well at the AlGaN/GaN interface (as illustrated in FIG. 5). The final result is the shutdown of the 2DEG 31 below the functional layer 34 even in the absence of gate voltages $V_G$. Consequently, the HEMT 20 is of normally-off type and this guarantees low power consumption thereof in use and simplifies its integration into electronic circuits during the design step.

Two-dimensional semiconductors such as $MoS_2$ have a crystal lattice with high correspondence with that of the AlGaN of the barrier layer 27 and this allows a growth of the functional layer 34 on the barrier layer 27 with high qualities and electrical and mechanical performances.

Moreover, with reference to the embodiment of the HEMT 20 of FIG. 6I, it has been verified that the presence of the second doped portions 40" of N-type of the functional layer 34 reduces the overdrive current of the HEMT 20 and therefore improves the reliability and electrical performances thereof.

The manufacturing processes of the HEMT 20 described are simple to perform and allow a self-aligned gate structure 32 to be created.

Finally, it is clear that modifications and variations may be made to the disclosure described and illustrated herein without thereby departing from the scope of the present disclosure, as defined in the attached claims. For example, the different embodiments described may be combined with each other so as to provide further solutions.

The passivation layer 42 may be absent, therefore the manufacturing process may not include the steps described with reference to FIGS. 6E, 6F, 7E, 7F. In this case the gate photoresist layer 64 extends in direct contact with the top surface 27*b* of the barrier layer 27 and with the functional layer 34.

Furthermore, in the absence of the source region 37 and the drain region 38, optionally the barrier layer 27 is partially recessed at the source and drain contacts 28 and 29. In fact, the partial recession of the barrier layer 27 carried out before the deposition of the source and drain contacts 28 and 29 (and the consequent annealing) reduces the specific contact resistance.

In one embodiment, a high-electron-mobility transistor, HEMT, device (20) in enhancement mode, includes a semiconductor body (35) having a top surface (27*b*) and including a heterostructure (25, 27) configured to generate a two-dimensional electron gas, 2DEG, (31). The HEMT device includes a gate structure (32) which extends on the top surface (27*b*) of the semiconductor body (35), is biasable to electrically control the 2DEG (31) and includes a functional layer (34) and a gate contact (33) in direct physical and electrical contact with each other. The gate contact (33) is of conductive material and the functional layer (34) is of two-dimensional semiconductor material and includes a first doped portion (40') with P-type electrical conductivity, which extends on the top surface (27*b*) of the semiconductor body (35) and is interposed between the semiconductor body (35) and the gate contact (33) along a first axis (Z).

The functional layer (34) may be formed by a two-dimensional semiconductor monolayer or by a two-dimensional semiconductor multilayer including a plurality of two-dimensional semiconductor monolayers superimposed on each other along the first axis (Z).

The two-dimensional semiconductor of the functional layer (34) may be one of: transition-metal dichalcogenide; phosphorene; antimonene; arsenene; tellurene; selenene; and 2D nitride.

The semiconductor body (35) may be of semiconductor material and may include, superimposed on each other along the first axis (Z): a substrate (23), a channel layer (25), and a barrier layer (27) having a bottom surface (27*a*) and a respective top surface (27*b*) opposite to each other along the first axis (Z), the bottom surface (27*a*) of the barrier layer (27) facing the channel layer (25) and the top surface (27*b*) of the barrier layer (27) forming the top surface (27*b*) of the semiconductor body (35). The 2DEG (31) may be configured to be generated at an interface between the channel layer (25) and the barrier layer (27).

The HEMT device (20) may further include a source contact (28) and a drain contact (29) which are of conductive material and extend on the top surface (27*b*) of the semiconductor body (35), at a distance from each other and from the gate structure (32). Along a second axis (X) orthogonal to the first axis (Z), the functional layer (34) extends at least partially between the source contact (28) and the drain contact (29). The gate contact (33) extends on the functional layer (34) so as to include, along the second axis (X), between the source contact (28) and the drain contact (29) or extends on part of the functional layer (34) so as not to include, along the second axis (X), between the source contact (28) and the drain contact (29).

The functional layer (34) may further include second doped portions (40") with N-type electrical conductivity and extending on the top surface (27*b*) of the semiconductor body (35), the first doped portion (40') extending, along the second axis (X), between the second doped portions (40").

In one embodiment, a manufacturing process of a high-electron-mobility transistor, HEMT, device (20) in enhancement mode, includes forming a semiconductor body (35) having a top surface (27*b*) and including a heterostructure (25, 27) configured to generate a two-dimensional electron gas, 2DEG, (31). The process includes forming, on the top surface (27*b*) of the semiconductor body (35), a gate structure (32) which is biasable to electrically control the 2DEG (31) and includes a functional layer (34) and a gate contact (33) in direct physical and electrical contact with each other. The gate contact (33) is of conductive material and the functional layer (34) is of two-dimensional semiconductor material and includes a first doped portion (40') with P-type electrical conductivity, which extends on the top surface (27*b*) of the semiconductor body (35) and is interposed between the semiconductor body (35) and the gate contact (33) along a first axis (Z).

The step of forming the gate structure (32) may include forming, on the top surface (27*b*) of the semiconductor body (35), the functional layer (34) having a first surface (34*a*) and a second surface (34*b*) opposite to each other along the first axis (Z), the first surface (34*a*) facing the semiconductor body (35). Forming the gate structure may include forming, on the functional layer (34), a gate photoresist layer (64) which exposes a first region (68') of the second surface (34*b*) of the functional layer (34). The first region (68') of the second surface (34*b*) of the functional layer (34) is adapted to define the first doped portion (40'). Forming the gate structure may include forming, on the gate photoresist layer (64) and on the first region (68') of the second surface (34*b*) of the functional layer (34), a gate conductive layer (70) of conductive material. A first portion of the gate conductive layer (70) extends on the gate photoresist layer (64) and a second portion of the gate conductive layer (70) extends on the functional layer (34) at the first region (68') of the second surface (34*b*). The process includes removing through lift-off the gate photoresist layer (64) and the first portion of the gate conductive layer (70). The second portion of the gate conductive layer (70) forms the gate contact (33).

The step of forming the functional layer (34) may include forming, through deposition on the top surface (27*b*) of the semiconductor body (35), a two-dimensional semiconductor layer (50) of two-dimensional semiconductor with N-type electrical conductivity. The process includes forming, on the two-dimensional semiconductor layer (50), a first photoresist layer (52) which covers a first region (50') of the two-dimensional semiconductor layer (50) and which exposes second regions (50") of the two-dimensional semiconductor layer (50), lateral to the first region (50') of the two-dimensional semiconductor layer (50). The process includes selectively removing, through a first etching (54) that is plasma-based, the second regions (50") of the two-dimensional semiconductor layer (50). The first region (50') of the two-dimensional semiconductor layer (50) is adapted to form the functional layer (34). The process includes removing the first photoresist layer (52) from the two-dimensional semiconductor layer (50). The manufacturing process may further include, following the formation of the gate photoresist layer (64), the step of exposing through the gate photoresist layer (64) the first region (68') of the second surface (34*b*) of the functional layer (34) to doping plasma configured to dope the two-dimensional semiconductor so as to form, at the first region (68') of the second surface (34*b*) of the functional layer (34), the first doped portion (40') with P-type electrical conductivity.

The step of forming the functional layer (34) may include forming, through deposition on the top surface (27*b*) of the semiconductor body (35) performed in the presence of one or more acceptor-type doping species, a two-dimensional semiconductor layer (50) of doped two-dimensional semiconductor with P-type electrical conductivity. Forming the functional layer may include forming, on the two-dimensional semiconductor layer (50), a first photoresist layer (52) which covers a first region (50') of the two-dimensional semiconductor layer (50) and which exposes second regions (50") of the two-dimensional semiconductor layer (50), lateral to the first region (50') of the two-dimensional semiconductor layer (50). Forming the functional layer may include selectively removing, through a first etching (54) that is plasma-based, the second regions (50") of the two-dimensional semiconductor layer (50), the first region (50') of the two-dimensional semiconductor layer (50) forming the first doped portion (40') of the functional layer (34). Forming the functional layer may include removing the first photoresist layer (52) from the first region (50') of the two-dimensional semiconductor layer (50).

The manufacturing process may further include the step of forming, on the top surface (27*b*) of the semiconductor body (35) and at a distance from the functional layer (34), a source contact (28) and a drain contact (29) of conductive material, the functional layer (34) extending, along a second axis (X) orthogonal to the first axis (Z), between the source contact (28) and the drain contact (29).

The manufacturing process may further include forming, on the second surface (34*b*) of the functional layer (34) and on regions of the top surface (27*b*) of the semiconductor body (35) extending between the functional layer (34) and the source contact (28) and between the functional layer (34) and the drain contact (29), a passivation layer (42) of passivating material. The process may include, following the formation of the gate photoresist layer (64) which extends on the passivation layer (42) so as to expose a first region (42') of the passivation layer (42) which is superimposed along the first axis (Z) on the first region (68') of the second surface (34*b*) of the functional layer (34), selectively removing, through a second etching (66), the first region (42') of the passivation layer (42), exposing the first region (68') of the second surface (34*b*) of the functional layer (34).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An enhancement mode high-electron-mobility transistor (HEMT) device, comprising:
a semiconductor body having a top surface and including a heterostructure configured to generate a two-dimensional electron gas (2DEG);
a gate structure on the top surface of the semiconductor body and including a functional layer and a gate contact in direct physical and electrical contact with the functional layer, wherein the gate structure is biasable to electrically control the 2DEG, wherein the gate contact is of conductive material and the functional layer is of two-dimensional semiconductor material and includes a first doped portion with P-type electrical conductivity on the top surface of the semiconductor body and is interposed between the semiconductor body and the gate contact along a first axis, wherein the gate contact includes a first gate contact and a second gate contact spaced apart from each other on the two-dimension semiconductor material in a first direction; and
a source contact and a drain contact each of conductive material and on the top surface of the semiconductor body and spaced apart from each other in a second direction orthogonal to the first direction, wherein the first and second gate contacts are spaced apart in the first direction by a distance larger than a width of the source contact and the drain contact in the first direction, wherein the source contact and the drain contact are spaced apart from each other in the second direction by a distance greater than a width of the first and second gate contacts in the second direction.

2. The HEMT device according to claim 1, wherein the functional layer includes a two-dimensional semiconductor monolayer or a two-dimensional semiconductor multilayer including a plurality of two-dimensional semiconductor monolayers superimposed on each other along the first axis.

3. The HEMT device according to claim 1, wherein the two-dimensional semiconductor of the functional layer is one of: transition-metal dichalcogenide; phosphorene; antimonene; arsenene; tellurene; selenene; and 2D nitride.

4. The HEMT device according to claim 1, wherein the semiconductor body is of semiconductor material and includes, superimposed on each other along the first axis:
a substrate;
a channel layer; and
a barrier layer having a bottom surface and a top surface opposite to each other along the first axis, the bottom surface of the barrier layer facing the channel layer and the top surface of the barrier layer forming the top surface of the semiconductor body, wherein the 2DEG is configured to be generated at an interface between the channel layer and the barrier layer.

5. The HEMT device according to claim 1, wherein the functional layer further includes second doped portions with N-type electrical conductivity on the top surface of the semiconductor body, the first doped portion extending, along a second axis, between the second doped portions.

6. A manufacturing process of an enhancement mode high-electron-mobility transistor (HEMT) device, the process comprising:
forming a semiconductor body having a top surface and including a heterostructure configured to generate a two-dimensional electron gas, 2DEG; and
forming, on the top surface of the semiconductor body, a gate structure biasable to electrically control the 2DEG and including a functional layer and a gate contact in direct physical and electrical contact with each other, wherein the gate contact is of conductive material and the functional layer is of two-dimensional semiconductor material and includes a first doped portion with P-type electrical conductivity on the top surface of the semiconductor body interposed between the semiconductor body and the gate contact along a first axis, wherein the gate contact includes a first gate contact and a second gate contact spaced apart from each other on the two-dimension semiconductor material in a first direction; and
forming a source contact and a drain contact each of conductive material and on the top surface of the semiconductor body and spaced apart from each other in a second direction orthogonal to the first direction, wherein the first and second gate contacts are spaced apart in the first direction by a distance larger than a width of the source contact and the drain contact in the first direction, wherein the source contact and the drain contact are spaced apart from each other in the second direction by a distance greater than a width of the first and second gate contacts in the second direction.

7. The manufacturing process according to claim 6, wherein forming the gate structure includes:
forming, on the top surface of the semiconductor body, the functional layer having a first surface and a second surface opposite to each other along the first axis, the first surface facing the semiconductor body;
forming, on the functional layer, a gate photoresist layer exposing a first region of the second surface of the functional layer adapted to define the first doped portion;
forming, on the gate photoresist layer and on the first region of the second surface of the functional layer, a gate conductive layer of conductive material, wherein a first portion of the gate conductive layer is on the gate photoresist layer and a second portion of the gate conductive layer is on the functional layer at the first region of the second surface; and
removing through lift-off the gate photoresist layer and the first portion of the gate conductive layer, the second portion of the gate conductive layer forming the gate contact.

8. The manufacturing process according to claim 7, wherein forming the functional layer includes:
forming, through deposition on the top surface of the semiconductor body, a two-dimensional semiconductor layer of two-dimensional semiconductor with N-type electrical conductivity;
forming, on the two-dimensional semiconductor layer, a first photoresist layer covering a first region of the two-dimensional semiconductor layer and exposing second regions of the two-dimensional semiconductor layer lateral to the first region of the two-dimensional semiconductor layer;
selectively removing, through a first plasma-based etching, the second regions of the two-dimensional semiconductor layer, wherein the first region of the two-dimensional semiconductor layer is adapted to form the functional layer;
removing the first photoresist layer from the two-dimensional semiconductor layer; and
exposing the first region of the second surface of the functional layer to doping plasma configured to dope the two-dimensional semiconductor to form the first doped portion with P-type electrical conductivity at the first region of the second surface of the functional layer.

9. The manufacturing process according to claim 7, wherein forming the functional layer includes:

forming, through deposition on the top surface of the semiconductor body performed in the presence of one or more acceptor-type doping species, a two-dimensional semiconductor layer of doped two-dimensional semiconductor with P-type electrical conductivity;

forming, on the two-dimensional semiconductor layer, a first photoresist layer covering a first region of the two-dimensional semiconductor layer and exposing second regions of the two-dimensional semiconductor layer, lateral to the first region of the two-dimensional semiconductor layer;

selectively removing, through a first plasma-based etching, the second regions of the two-dimensional semiconductor layer, the first region of the two-dimensional semiconductor layer forming the first doped portion of the functional layer; and removing the first photoresist layer from the first region of the two-dimensional semiconductor layer.

10. The manufacturing process according to claim 9 further comprising:

forming a passivation layer of passivating material on the second surface of the functional layer and on regions of the top surface of the semiconductor body extending between the functional layer and the source contact and between the functional layer and the drain contact; and selectively removing, through a second plasma-based etching, a first region of the passivation layer to expose the first region of the second surface of the functional layer.

11. A method, comprising:

forming a heterostructure of an enhancement mode high-electron-mobility transistor (HEMT) device, the heterostructure including a channel layer and a barrier layer on the channel layer;

forming a functional layer of a gate structure of the HEMT device on the barrier layer by depositing a two dimensional semiconductor material on the barrier layer;

forming a gate contact of the gate structure on the functional layer, wherein the functional layer has a first portion directly below the gate contact and a second portion that is not directly below the gate contact; and forming a source contact and a drain contact of the HEMT device on the barrier layer and spaced apart from the functional layer, wherein the gate contact includes a first gate contact and a second gate contact spaced apart from each other on the two-dimension semiconductor material in a first direction, wherein the source contact and the drain contact spaced apart from each other in a second direction orthogonal to the first direction, wherein the first and second gate contacts are spaced apart in the first direction by a distance larger than a width of the source contact and the drain contact in the first direction, wherein the source contact and the drain contact are spaced apart from each other in the second direction by a distance greater than a width of the first and second gate contacts in the second direction.

12. The method of claim 11, comprising:

doping the first portion of the functional layer with a first conductivity type; and doping the second portion of the functional layer with a second conductivity type opposite of the first conductivity type.

13. The method of claim 11, wherein forming the source and drain contacts includes:

depositing a first layer of photoresist on the functional layer and on the barrier layer;

exposing portions of the barrier layer by patterning the photoresist;

depositing a first layer of conductive material on the exposed portions of the barrier layer and on the photoresist; and defining the source and drain contacts from the first layer of conductive material by performing a first liftoff process of the first layer of photoresist.

14. The method of claim 13, wherein forming the gate contact includes:

depositing a second layer of photoresist on the functional layer and the source and drain contacts;

exposing the first portion of the functional layer by patterning the second layer of photoresist;

depositing a second layer of conductive material on the first region of the functional layer and on the source and drain contacts; and defining the gate contact from the second layer of conductive material by performing a liftoff process of the second layer of photoresist.

15. The method of claim 11, comprising depositing a passivation layer on the second portion of the functional layer and on the barrier layer between the second portion of the functional layer and the source contact.

16. The method of claim 11, wherein forming the functional layer includes depositing a single mono-layer of transition-metal dichalcogenide.

17. The method of claim 16, wherein the transition-metal dichalcogenide includes molybdenum.

18. The method of claim 11, wherein the forming the functional layer includes depositing multiple mono-layers of transition-metal dichalcogenide.

* * * * *